(12) United States Patent
Xie (10) Patent No.: US 7,402,884 B2
(45) Date of Patent: Jul. 22, 2008

(54) LOW CROSSTALK SUBSTRATE FOR MIXED-SIGNAL INTEGRATED CIRCUITS

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 142 days.

(21) Appl. No.: 11/402,209

(22) Filed: Apr. 10, 2006

(65) Prior Publication Data

US 2006/0255425 A1    Nov. 16, 2006

Related U.S. Application Data

(63) Continuation of application No. PCT/US2004/041566, filed on Dec. 10, 2004.

(60) Provisional application No. 60/528,955, filed on Dec. 10, 2003.

(51) Int. Cl.
*H01L 29/00* (2006.01)
(52) U.S. Cl. .............................. 257/499; 257/E25.029; 257/500; 257/659; 257/E25.031
(58) Field of Classification Search ................. 257/499, 257/E25.029
See application file for complete search history.

(56) References Cited

U.S. PATENT DOCUMENTS

| 5,583,378 A * | 12/1996 | Marrs et al. ................. 257/710 |
| 5,767,561 A   |  6/1998 | Frei et al. |
| 5,889,314 A * |  3/1999 | Hirabayashi ................. 257/508 |
| 2001/0023111 A1* | 9/2001 | Yuan ........................... 438/409 |
| 2003/0059541 A1* | 3/2003 | Ogure ......................... 427/383.1 |

OTHER PUBLICATIONS

J. Ankarcrona et al. Low resistivity SOI for substrate crosstalk reduction. IEEE Electron Device Lett., vol. 52, pp. 1920-1922 (2005).

P.M. Asbeck et al. GaAlAs/GaAs heterojunction bipolar transistors: issues and prospects for application. IEEE Trans. Electron Devices, vol. 36, pp. 2032-2042 (1989).

K.B. Ashby et al. High Q inductors for wireless applications in a complementary silicon bipolar process. IEEE J. Solid-State Circuits, vol. 31, pp. 4-9 (1996).

K. Benaissa et al. RF CMOS on high-resistivity substrates for system-on-chip applications. IEEE Trans. Electron Devices, vol. 50, pp. 567-576 (2003).

J.N. Burghartz et al. On the design of RF spiral inductors on silicon. IEEE Trans. Electron Devices, vol. 50, pp. 718-729 (2003).

(Continued)

*Primary Examiner*—Tu-Tu V Ho
(74) *Attorney, Agent, or Firm*—John P. O'Banion (57) ABSTRACT

An integrated circuit laminate with a metal substrate for use with high performance mixed signal integrated circuit applications. The metal substrate provides substantially improved crosstalk isolation, enhanced heat sinking and an easy access to a true low impedance ground. In one embodiment, the metal layer has regions with insulation filled channels or voids and a layer of insulator such as unoxidized porous silicon disposed between the metal substrate and a silicon integrated circuit layer. The laminate also has a plurality of metal walls or trenches mounted to the metal substrate and transacting the silicon and insulation layers thereby isolating noise sensitive elements from noise producing elements on the chip. In another embodiment, the laminate is mounted to a flexible base to limit the flexion of the chip.

20 Claims, 7 Drawing Sheets

OTHER PUBLICATIONS

J.N. Burghartz. Progress in RF inductors on silicon—Understanding substrate losses. IEDM Tech. Digest, pp. 523-526 (1998).

T.S. Chen et al. An efficient noise isolation technique for SOC application. IEEE Trans. Electron Devices, vol. 51, pp. 255-260 (2004).

K. Chong et al. High performance inductors integrated on porous silicon. IEEE Electron Device Lett., vol. 26, pp. 93-95 (2005).

E.M. Chow et al. Process compatible polysilicon-based electrical through-wafer interconnects in silicon substrates. J. Microelectromech. Syst., vol. 11, pp. 631-640 (2002).

Y. Hiraoka et al. New substrate-crosstalk reduction using SOI substrate. IEEE International SOI Conference, pp. 107-108 (2001).

A. Hürrich et al. COI-CMOS technology with monolithically integrated active and passive RF devices on high resistivitySIMOX substrates. IEEE International SOI Conference, pp. 130-131 (1996).

H. Jiang et al. Reducing silicon-substrate parasitics of on-chip transformers. Proceedings of IEEE Micro Electro Mechanical Systems, Las Vegas, Nevada, pp. 649-652 (2002).

K. Joardar. Signal isolation in biCMOS mixed mode integrated circuits. Bipolar/BiCMOS Circuits and Technology Meeting, pp. 178-181 (1995).

R.A. Johnson et al. Comparison of microwave inductors fabricated on silicon-on-sapphire and bulk silicon. IEEE Microwave and Guided Wave Lett., vol. 6, pp. 323-325 (1996).

M.-D. Ker et al. Design on the low-capacitance bond pad for high-frequency I/O circuits in CMOS. IEEE Trans. Electron Devices, vol. 48, pp. 2953-2956 (2001).

M. Kumar et al. Novel isolation structures for TFSOI technology. IEEE Electron Device Lett., vol. 22, pp. 435-437 (2001).

K. Lakdawala et al. Micromachined high-Q Inductors in a 0.18-um copper interconnect low-K dielectric CMOS process. IEEE J. Solid-State Circuits, vol. 37, pp. 394-403 (2002).

S. Lam et al. High-isolation bonding pad design for silicon RFIC up to 20GHz. IEEE Electron Device Lett., vol. 24, pp. 601-603 (2003).

J.P.Z. Lee et al. Substrate cross talk noise characterization and prevention in 0.35 um CMOS technology. IEEE Custom Integrated Circuits Conference, pp. 479-482, (1999).

T. Mizoguchi et al. A 250-pixel SIT image sensor operating in its high-sensitivity mode. IEEE Trans. Electron Devices, vol. 38, pp. 1021-1027 (1991).

O.H. Murphy et al. Design of multiple-metal stacked inductors incorporating an extended physical model. IEEE Trans. Microwave Theory and Techniques, vol. 53, pp. 2063-2072 (2005).

M. Park et al. The detailed analysis of high Q CMOS-compatible microwave spiral inductors in silicon technology. IEEE Trans. Electron Devices, vol. 45, pp. 1953-1959 (1998).

M. Pfost et al. An experimental study on substrate coupling in bipolar/biCMOS technologies. IEEE J. Solid-State Circuits, vol. 39, pp. 1755-1763 (2004).

N.P. Pham et al. IC-compatible two-level bulk micromachining process module for RF silicon technology. IEEE Trans. Electron Devices, vol. 48, pp. 1756-1764 (2001).

J.P. Raskin et al. Substrate crosstalk reduction using SOI technology. IEEE Trans. Electron Devices, vol. 44, vol. 44, pp. 2252-2261 (1997).

R.P. Ribas et al. Micromachined microwave planar spiral inductors and transformers. IEEE Trans. Microwave Theory and Techniques, vol. 48, pp. 1326-1335 (2000).

S.M. Sinaga et al. Through-substrate trenches for RF isolation in wafer-level chip-scale package. Electronics Packaging Technology Conference, pp. 13-17 (2004).

R. Singh. A review of substrate coupling issues and modeling strategies. IEEE Custom Integrated Curcuits Conference, pp. 491-498 (1998).

S. Stefanou et al. Ultralow silicon substrate noise crosstalk using metal Faraday cages in an SOI technology. IEEE Trans. Electron Devices, vol. 51, pp. 486-491 (2004).

D.D. Tang et al. The integration of proton bombardment process into the manufacturing of mixed-signal/RF chips. IEDM Tech. Digest, pp. 673-676 (2003).

N.J. Thomas et al. High performance thin-film silicon-on-insulator CMOS transistors in porous anodized silicon. IEEE Electron Device Lett., vol. 10, pp. 129-131 (1989).

K.H. To et al. Comprehensive study of substrate noise isolation for mixed-signal circuits. IEDM Tech. Digest, pp. 519-522 (2001).

J.H. Wu et al. A through-wafer interconnect in silicon for RFICs. IEEE Trans. Electron Devices, vol. 51, pp. 1765-1771 (2004).

S.M. Yim et al. The effects of a ground shield on the characteristics and performance of spiral inductors. IEEE J. Solid-State Circuits, vol. 37, pp. 237-244 (2000).

C.P. Yue et al. On-chip spiral inductors with patterned ground shields for Si-based RF IC's. IEEE J. Solid-State Circuits, vol. 33, pp. 743-752 (1998).

* cited by examiner

LOW CROSSTALK SUBSTRATE FOR MIXED-SIGNAL INTEGRATED CIRCUITS

CROSS-REFERENCE TO RELATED APPLICATIONS

This application claims priority from, and is a 35 U.S.C. § 111(a) continuation of, co-pending PCT international application serial number PCT/US2004/041566, filed on Dec. 10, 2004, incorporated herein by reference in its entirety, which designates the U.S., which claims priority from U.S. provisional application Ser. No. 60/528,955 filed on Dec. 10, 2003, incorporated herein by reference in its entirety.

STATEMENT REGARDING FEDERALLY SPONSORED RESEARCH OR DEVELOPMENT

This invention was made with Government support under Grant No. SRCF 2001-NJ-936, awarded by the National Science Foundation. The Government has certain rights in this invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to mixed signal integrated circuit board applications, and more particularly to an integrated circuit board with a metal substrate with excellent crosstalk isolation capabilities, enhanced heat sinking and true ground.

2. Description of Related Art

The rapidly growing markets for mobile communications and wireless networking have created a demand for high-performance mixed-signal radio frequency integrated circuits (MSIC). Such circuits are typically composed of a combination of metal oxide semiconductor (MOS) digital circuits with analog circuit elements including passive components such as inductors on a single chip. These circuits have the advantage of smaller form factor, higher packing density and lower cost.

However, the integration of high performance analog circuits with noisy digital circuits at high frequencies is often limited or hampered by the presence of digital noise called "crosstalk" that inevitably interferes with analog circuit function. For example, noise from switching transients in digital circuits can travel through the silicon substrate and degrade the function of sensitive circuit elements such as low noise amplifiers or phase-lock loops. Integrated inductors and other circuit elements can act as antennas that receive spurious signals and other substrate noise from other sections of the substrate.

Suppression of substrate noise is critical to system-on-chip (SOC) feasibility and design. A number of approaches have been attempted to isolate sensitive elements from crosstalk interference. High resistivity silicon, junction isolated wells, silicon-on-insulator (SOI) wafers, guard rings, and micromachined structures have been used to suppress crosstalk through the substrate with limited success. In addition, bulk machining, guard rings and high resistivity silicon is costly and may degrade during exposure to high temperatures. At high frequencies, the limited oxide thickness of SOI substrates that are required to avoid structural failure due to thermal expansion mismatch cannot provide sufficient RF crosstalk isolation due to the inverse dependence of the impedance of capacitive channels on the frequency and the fact that high impedance, in addition to high resistance, is necessary to isolate radio frequency crosstalk.

Accordingly, there is a need for a substrate structure that will minimize substrate loss for radio frequency or microwave passive components, coplanar wave guide (CPW) lines, and crosstalk between the digital, analog, RF or microwave circuit blocks via the substrate. The present invention satisfies this need, as well as others, and generally overcomes the deficiencies of the prior art.

BRIEF SUMMARY OF THE INVENTION

The present invention generally comprises an integrated circuit laminate with a metal substrate for high performance mixed signal integrated circuit applications. The metal substrate provides substantially improved crosstalk isolation, enhanced heat sinking and an easy access to true low impedance ground. One of the major obstacles of the production of single chip radio frequency integrated circuits is noise from switching transients in digital circuits traveling though the silicon substrate and interfering with the performance of noise sensitive circuit elements on the same chip. In addition, inductors are essential components in radio frequency circuits and are used to filter and decouple AD/DC signals and for impedance matching. Capacitive and electromagnetic coupling between the inductor and the metal substrate is avoided with insulator filled pockets in the metal substrate under the inductors.

According to one aspect of the invention, a laminate of a thin silicon layer mounted to a metal substrate is provided with a plurality of metal walls or trenches isolating noise sensitive elements from noise producing elements on the chip. In one embodiment, the substrate and silicon active layer are joined by conductive epoxy. In another embodiment, the silicon layer is preferably less than approximately 4.5 µm thick. The metal substrate layer can preferably range from approximately 100 µm to approximately 5 mm in thickness.

According to another aspect of the invention, metal insulating walls or trenches cut in the silicon and coupled with the metal substrate are provided that can vary in width and are normally the same thickness as the silicon layer. The width of insulating metal walls can vary but preferably ranges from approximately 1 µm to approximately 1000 µm in thickness as necessary to isolate noisy or sensitive components.

A still further aspect of the invention is to provide a laminate of a thin silicon layer mounted to a metal substrate with a plurality of metal walls or trenches isolating noise sensitive elements from noise producing elements on the chip further comprising a layer of an insulator. One preferred insulator is unoxidized porous silicon. In one embodiment, the metal substrate has additional sections under the inductors and similar components that are preferably filled with an insulating material such as porous silicon. The thickness of the insulating material in the metal substrate preferably ranges from 10 μm to 800 μm. The width of the insulating section in the metal substrate is variable depending on the size of the inductor.

In one embodiment of the invention an integrated circuit laminate is provided with at least one inductor on top of a plurality of active silicon integrated circuit layers; an insulation layer joined to the bottom of the active silicon layers. A metal substrate having a plurality of insulation filled voids is coupled to the insulation layer. In another embodiment the entire integrated circuit laminate is mounted to a flexible base with a pliant adhesive such as soft glue. This allows the active silicon/metal laminate to bend at a different radius than the flexible base.

According to another aspect of the invention, an integrated circuit laminate is provided that has a first oxide layer, a second oxide layer, a porous silicon oxide layer disposed on a metal substrate. In this embodiment, the porous silicon oxide layer preferably ranges from 4 μm to 100 m in thickness.

In another aspect of the invention, a method of fabrication of a RF integrated circuit laminate is provided.

An object of the invention is to provide a RF integrated circuit chip with a metal substrate that provides an enhanced heat sink over silicon bulk substrates.

Another object of the invention is to provide a RF integrated circuit chip design that effectively eliminates crosstalk between components even at high frequencies via a grounded shield.

A further object of the invention is to provide an integrated circuit laminate that practically eliminates the concern about the fluctuation of grounding point potentials and making every ground on the chip surface a true ground with very low impedance.

Still another object of the invention is to provide a RF integrated circuit chip design that effectively eliminates eddy current effects under inductor elements.

Further objects and aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus and methods generally shown in FIG. 1 through FIG. 7E. It will be appreciated that the apparatus may vary as to configuration and as to details of the parts, and that the methods may vary as to the specific steps and sequence, without departing from the basic concepts as disclosed herein.

Market demands for miniaturization, greater functionality, high performance and reduced cost have created the need for integrating noisy digital and sensitive analog components on the same chip. However, the integration of analog and digital circuits combined with need for enhanced heat dissipation capability and higher operating frequencies produces a number of engineering challenges.

The present invention generally comprises a specially engineered metal substrate that provides a grounding shield for RF crosstalk isolation, efficient heat sinking for the chip and a true ground contact point within a few microns of the substrate surface. The metal substrate is preferably a replacement of conventional bulk Si substrates of CMOS or other digital integrated circuits. Crosstalk isolation of noisy or sensitive circuits or components is further provided with metal filled or metal lined trenches as well as layers of insulating materials. Crosstalk reductions in the =120 dB levels as required by high-end mixed-signal applications can be obtained.

Figure 1:
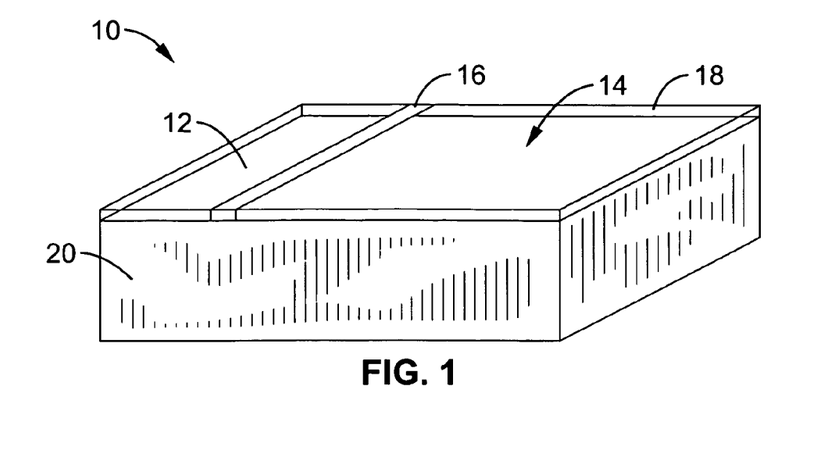
FIG. 1 is a schematic diagram of an integrated circuit chip with a metal substrate and metallized post or trench according to the invention.

Turning now to the schematic representation of one embodiment of a chip 10 with a metal substrate shown in FIG. 1, it can be seen that the sensitive analog circuits 12 and the noisy digital circuits 14 are separated and isolated from each other by a metallized post or filled trench 16. Generally, the thin silicon layers 18 of the digital circuits 14 and analog circuits 12 are disposed on a grounding metal substrate 20 in the embodiment shown. The active silicon layer 18 preferably has a thickness of approximately 4.5 μm or less.

The preferred metal substrate 20 is composed of copper or copper alloy because of its high thermal and electrical conductivity. The metal substrate layer preferably ranges from approximately 100 μm to approximately 5 mm in thickness. Although copper is preferred, it will be understood that other metals and alloys may also be used as a substrate. It is preferred that the Si thin film and metal substrate layers be joined using conductive epoxy. Curing temperatures for the different types of conducting epoxy range from room temperature to several hundred degrees centigrade. The maximum allowable operating temperatures for integrated circuits typically range from −30° C. and 180° C. with a differential of approximately 130° C.

One concern with the use of metal substrates is the thermal expansion coefficient mismatch between the silicon and the metal substrate that could lead to excessive stress in the silicon and cause the failure of the device. The direct consequence of the thermal expansion coefficient mismatch in a layered structure is significant strain in all but the thickest layer. In this case, the final in-plane expansion or contraction is essentially determined by the substrate. Excessive strain may lead to cracking or delamination. In single crystalline films, stress can lead to plastic deformation through dislocation. For a given strain value, there is a well-established critical layer thickness beyond which dislocation becomes energetically favorable. The maximum strain due to thermal expansion mismatch between copper and silicon can be calculated to be approximately 0.2%.

It has been shown that dislocation is kinetically inhibited in Si films up to 4.5 μm in thickness that are under biaxial stress when the metal and silicon layers are annealed at 550° C. The probability of surmounting the kinetic barrier for dislocation nucleation at 200° C. is reduced from that at 500° C. by approximately 1.7 times. Experimentally, dislocation is virtually non-existent at the typical range of operating temperatures. Therefore, the structure is free from dislocations due to thermal expansion.

Furthermore, from the perspective of electron transport, the effect of the 0.2% strain is beneficial. The relative shift in energy of valleys with different symmetry is expected to be around 0.03 eV at 0.2% strain. As a result, there may be a noticeable shift in how the various valleys are populated for both electrons and holes. For $T > T_0$, the temperature at which the metal substrate and the thin, circuit containing Si layer are structurally bonded together, Si is under tensile strain leading to a lower average electron effective mass in plane based on the same principle of strained Si. For temperatures less than $T_0$, the Si is under compression. The four fold degenerative valleys are preferentially occupied making the average electron effective mass heavier. However, this effect is diluted by a factor of 4/6 as the electrons in the two fold valleys are distributed along the four fold heavier valleys. Thus, it can be seen that the mobility decrease at low temperatures is less than the increase at high operating temperatures. Accordingly, there will not be any negative impact from the mismatch in thermal expansion coefficients if the silicon thin films are provided that are thinner than approximately 4 μm in thickness. The residual stress in the laminate is shown to be beneficial rather than destructive.

Two significant benefits of the use of a metal substrate are the improved thermal conductivity and impedance of the system over bulk Si substrates. The metal substrate makes every ground point on the surface of the chip a "true ground" with the essential elimination of grounding point potential "bounce." Furthermore, the improvement in the substrate as a "heat sink" over conventional substrates allows chip power consumption to increase by approximately 2.5 times for a given maximum operating temperature.

The series impedance to system ground from an arbitrary point on the chip surface is composed of mainly the self-inductance as well as the resistance of the connection wire. At high frequencies, the impedance of a point on the Si surface to the backside of the chip (assuming this is the reference point for the ground) is dominated by the self-inductance of the connecting wires. For a conventional Si chip that is 1 cm×1 cm in size, an average ground point within the circuit has the distance of approximately 1 cm from the ground contact on the package. In comparison, the length of the connection from anywhere on the surface of Si to the backside using the metal substrate of the present invention is the thickness of the Si substrate, which is approximately 4 μm in the preferred embodiment and can be treated as the same potential as the backside of the chip.

In addition, the impedance of a 1 cm wire at a frequency (f) can be expressed as $Z = 2\pi f L$, where L is approximately 1 nH. For example for a frequency (f)=10 GHz, the value Z is approximately 60 Ohms. The voltage drop for a current of 10 mA is 0.6 Volts. Accordingly, the actual potential at the various ground points across the chip could differ by as much as 0.6 V, a significant fraction of $V_{DD}$. The voltage drop becomes more important for low voltage circuits. In contrast, with the metal substrate, (Z) is 2500 times smaller than the conventional circuits making all ground contacts in the Si chip surface a much "truer" ground in this example. It can be seen that the potential variation is reduced from 600 mV to less than 1 mV. As a result, the metal substrate of the present invention practically eliminates the concern of the fluctuation of grounding point potentials in conventional chips since every ground point on the chip surface is a true ground.

The metal substrate in close proximity to the surface of high-density digital circuits also provides a much improved heat sink over conventional substrates allowing for circuit designs with increased chip power consumption.

Present industry standards contemplate the maximum ambient temperature to be 180° C. with the maximum allowable junction temperature of 195° C. The standards further demand that the thermal impedance of a chip should allow for the dissipation of about 290 Watts (ITRS) of power per centimeter squared with less than 25° C. temperature differential between the chip surface and the ambient temperature in the vicinity.

The thermal impedance of the chip may be determined by the metal laminate that consists of approximately 4 μm thick Si film in series with a 250 μm Cu substrate in this example. In the steady state, the rate of heat generation at the Si surface by the operating circuit must be equal to the heat flow through the 4 μm Si layer that is equal to the flow of heat through the copper substrate. Assuming the maximum power consumption of a one square centimeter chip to be 290 Watts, the heat flow across the chip has been calculated to be between 0.08° C. and 1.8° C. making the overall temperature drop less than 2° C. In other words, for a given maximum operating temperature, the use of a metal substrate allows chip power consumption to increase 2.5 times over present bulk silicon substrates.

In another embodiment (not shown), the metal substrate is configured to permit the flow of liquid coolant for heat transfer from the substrate. It can be seen that it is much easier to fabricate pipes or channels into a metal substrate to facilitate the liquid coolant flow than it is to make channels into conventional Si substrates. This is another advantage of the current invention when liquid cooling for chips becomes the industry standard.

Referring again to FIG. 1, effective crosstalk isolation of analog circuits 12 and digital circuits 14 can be accomplished by using either a very insulating substrate that blocks noise using high impedance materials such as porous silicon or a very conductive substrate. The conductor provides an efficient pathway for noise to return to the ground before reaching the noise sensitive circuits and is conventionally known as electromagnetic wave shielding. The isolation approach is capable of reducing crosstalk to the level similar to that across air gaps. However, a much more effective scheme for the reduction of crosstalk has to be employed in order to further reduce the crosstalk to suitable levels.

In the embodiment shown in FIG. 1, a conductive metal wall 16 is electrically connected to the metal substrate 20 that effectively encapsulates and isolates the noise generating from the noise sensitive circuits with either a metal substrate or a metal wall. The width of insulating metal walls preferably ranges from approximately 1 μm to approximately 1000 μm in width as needed to isolate noisy or sensitive components. The thickness of the walls is preferably the thickness of the silicon layer.

RF crosstalk between two points on a chip can be simulated with great accuracy using commercially available software tools such as HFSS that show quantitatively the expected crosstalk at various frequencies. Generally scattering parameter ($S_{21}$) is used to represent the ratio of noise power coupled through to port 2 to that of the incident noise power at port 1. The objective of crosstalk isolation is to reduce $S_{21}$.

In addition to crosstalk reduction, another serious challenge in Si mixed-signal integrated circuit technology is the fabrication of high performance on-chip inductors. High performance spiral inductors on silicon substrates are important components in monolithic radio frequency circuits such as low noise amplifiers, voltage-controlled oscillators and passive filters. Inductors may also be essential components in low loss impedance matching networks, baluns, transformers and tuned amplifiers and the like. The planar spiral inductor, for example, can be easily built on a highly resistive silicon substrate using current integrated circuit manufacturing techniques. The typical spiral inductor of this type includes at least one metal layer for the main coil and an underpass connection to the inner terminal of the inductor. However, one major difficulty encountered with monolithic or on-chip inductors is the absence of a magnetic core to confine magnetic flux. Consequently, flux leakage often interferes with nearby components.

The performance of on-chip inductors can be estimated primarily by the analysis of three parameters: inductance (L), the quality factor (Q), and the self-resonant frequency ($f_r$). The relationship between these three parameters is shown in the equations, $(f_r)=1/2\pi(LC)^{-2}$ and $(Q)=2\pi\, fL/R$. Where (C) includes the capacitance between the inductor and ground in addition to the capacitance between the two ends of the same inductor (i.e. the inter-winning capacitance). Additionally, the (f) term represents the operating frequency and (R) term includes the resistance of the metal line plus the apparent resistance resulting from eddy currents induced in the substrate. Eddy currents, governed by Faraday's law, occur when a conductor is subject to magnetic fields that vary over time. Eddy currents produce their own magnetic fields that oppose the original field according to Lenz's law.

Generally, the Q factor is an indication of how effectively energy can be stored in the inductor against the energy dissipation by the loss. Accordingly, maximizing the Q factor is desirable.

Since the purpose of an inductor is to store magnetic energy, the resistance or capacitance of the inductor are considered parasitic. Accordingly, any energy stored in the electric fields of the inductor is counterproductive and resistance dissipates energy through ohmic loss. The Q factor is proportional to the stored magnetic energy, which is generally equal to the difference between the peak magnetic energy minus the electrical energy. When the peak magnetic energy and electrical energy are equal, the inductor is at self-resonance and the Q factor is zero. Therefore the resonant frequency is defined as the frequency when the Q factor is at zero. When frequencies are above the self resonant frequency ($f_r$), there is no net magnetic energy available to external circuits from the inductor.

Eddy currents produce both skin and proximity effects. Skin effects are eddy currents in the conductor itself that are created from current flow in a conductor. Proximity effects are produced by a second conductor carrying a time varying current that is in close proximity. The eddy current will be produced regardless of whether the first conductor is carrying current and is a transformer like condition. Accordingly, the distribution of the eddy currents will depend on the geometry and spacing of the conductors. With regard to on-chip inductors, proximity effects between the inductor coil and the semiconducting substrate are of main concern. AC current in the coil induces eddy currents in the substrate, which in turn induces an electromotive force in the inductor coil that manifests itself as an apparent increase in resistance. From the energy perspective, eddy currents in the substrate dissipate a portion of the energy stored in the inductor leading to lower Q values.

It can be seen that the eddy currents reduce the net flow of current in a conductor and therefore an effective increase in resistance in the conductor regardless of the mechanism of induction. In the case of the spiral inductor, the current running through one section of the coil can cause eddy currents in nearby sections of the inductor due to the close proximity of the turned sections. The inductor can also cause eddy currents in other components as well.

In sum, practical on-chip inductors or similar components require a relatively high quality (Q) factor and the self resonance frequency ($f_r$), determined by inductance (L) and capacitance (C), must also be sufficiently high for most applications. It has been shown that on-chip inductors of (L) approximately 4 nH with (Q)>15 and ($f_4$) >15 GHz can be achieved in chips with thin metal substrates according to the invention.

The present invention may be more particularly described in the following examples that are intended for illustrative purposes only, since numerous modifications, adaptations and variations to the apparatus and methods will be apparent to those skilled in the art.

EXAMPLE 1

Figure 2A:
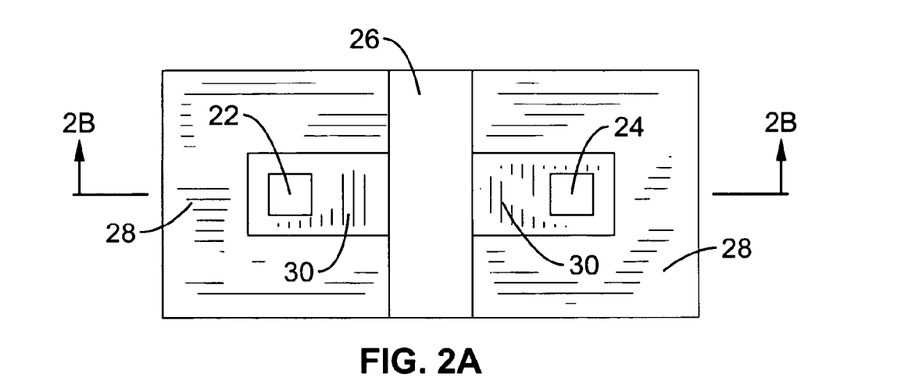
FIG. 2A is a top view of structure of a chip with a metal substrate and metal post to test the shielding scheme of the present invention.
Figure 2B:
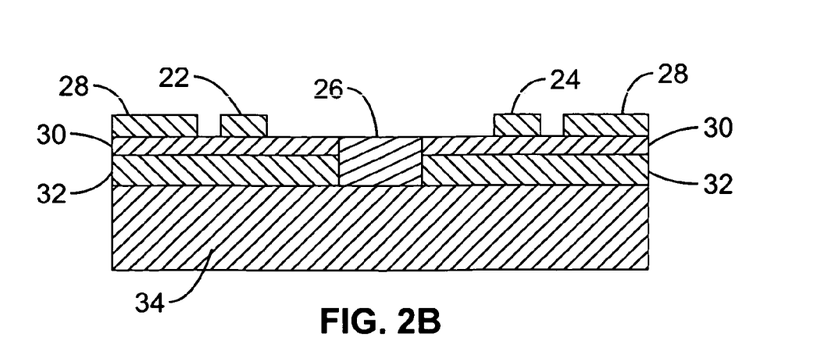
FIG. 2B is a cross-section of the structure of FIG. 2A taken along the lines 2B-2B.

A preliminary test of the concept of crosstalk isolation was conducted using a test chip configuration shown in top and cross-sectional views in FIG. 2A and FIG. 2B. The chip was configured with two metal pads 22 and 24 separated by a metal trench 26. The pads 22 and 24 and the ground plane 28 are approximately 5000 angstroms thick aluminum and the pads were square shaped with 100 μm×100 μm sides. A distance of approximately 800 μm separated the pads 22 and 24. The metal trench 26 is physically and electrically connected to the grounding plane 28.

As seen in the cross-section of FIG. 2B, the pads 22, 24 and ground plane 28 are disposed on a dielectric layer 30 that is preferably composed of PECVD $SiO_2$. The dielectric layer is approximately 5000 angstroms thick in this example.

A substrate layer 32 of (p-) Silicon about 2 μm thick with approximately 10 Ω-cm resistivity was attached to a metal plate 34 on the bottom side and the dielectric layer 30 on the top side to complete the structure. The metal plate was 1 mm thick and made of copper. It can be seen that in addition to the ground plane 28 on top of the laminate, there is a second ground plane 34 at the bottom and the metal filled trench 26 interconnects these ground planes. The dimensions of the metal filled trench 26 had a thickness or height of approximately 2.5 μm and a width of approximately 2 μm in the test chip shown in FIG. 2B.

The test structure was analyzed using High Frequency Structure Simulator (HFSS) to simulate the expected $S_{21}$. As seen in the graph of crosstalk as a function of frequency in FIG. 3, the test structure significantly suppressed crosstalk at different widths of trench 26. Curve 36 of FIG. 3, indicates the magnitude crosstalk $S_{21}$ in decibels for frequencies to 40 GHz. Curve 38 is the expected crosstalk with a trench that is 1 μm in width. Curve 40 is for a trench with a width of 10 μm and curve 42 for a width of 100 μm. For trench widths of 10 μm or greater, a crosstalk values as low as approximately −120 dB can be achieved throughout the spectrum of frequencies. The trench width dependence of $S_{21}$ is attributed primarily to skin effects. For identical test structures, the shielding scheme outperforms the silicon in insulator (SOI) counterpart by at least 60 dB at 40 GHz.

Figure 3:
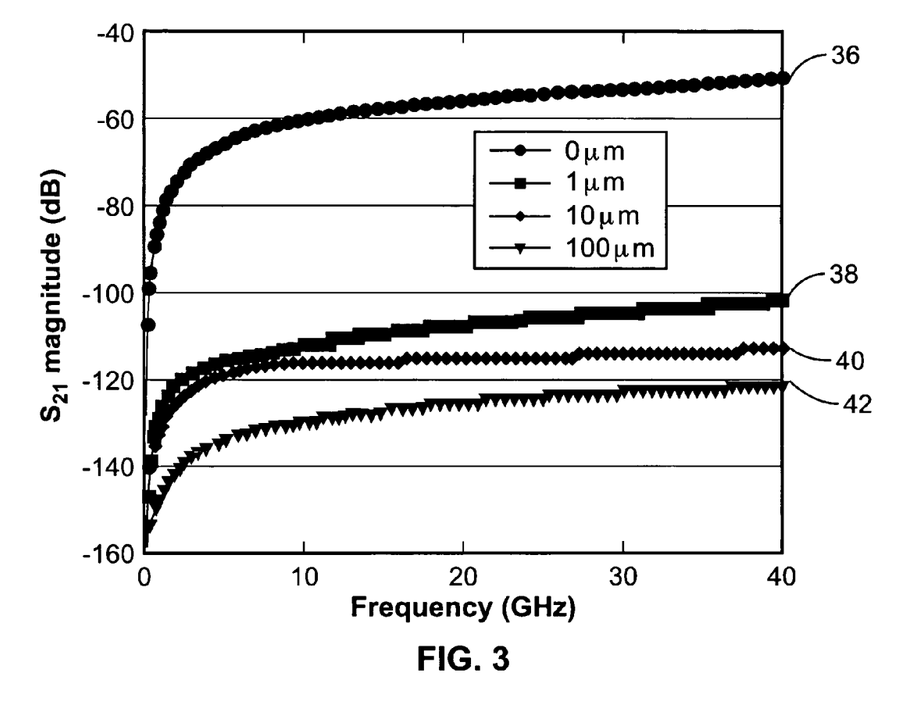
FIG. 3 is a graph of HFSS crosstalk as a function of frequency for different trench widths as indicated.

The results shown in FIG. 3 indicate that even a narrow metal trench line can be very effective in isolating the circuits. It can be seen that the absolute isolation value of −120 dB over 40 GHz will allow the creation of many high performance circuit designs that cannot be produced with current technology including Silicon-On-Insulator technology.

EXAMPLE 2

Figure 4A:
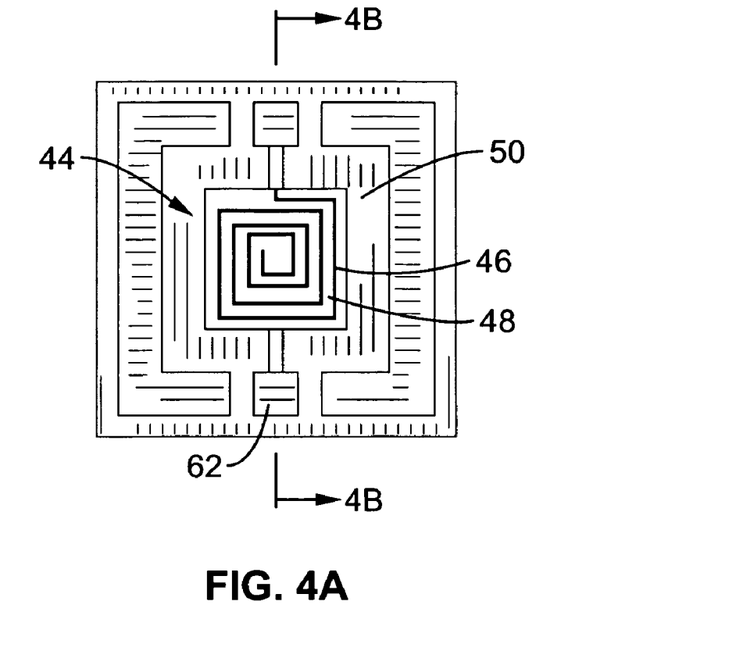
FIG. 4A is top view of an on-chip spiral inductor over the insulator filled region of a copper metal sheet according to the invention.
Figure 4B:
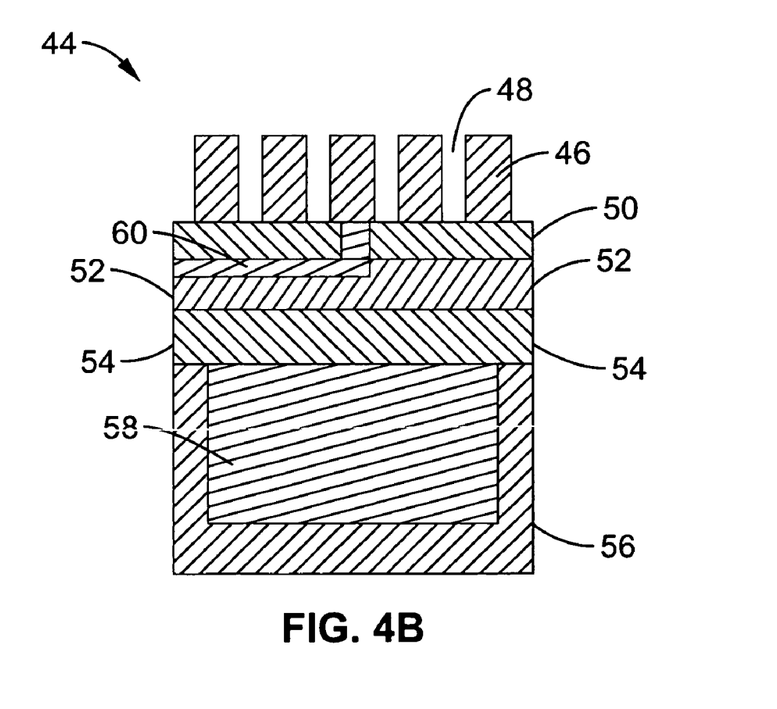
FIG. 4B is a cross-sectional view of the on-chip spiral inductor of FIG. 4A taken along the lines 4B-4B.

Capacitive and electromagnetic coupling between the inductor and the metal substrate may limit the inductor performance and restrict design freedom. However this coupling can be overcome with insulator filled pockets in the metal substrate under the inductor. Turning now to FIG. 4A and FIG. 4B, an on-chip inductor structure for a 4 nH inductor is shown. The inductor 44 has 5.5 turns with segment 46 width of 12 μm and the space 48 between the segments 46 was 4 μm. The inner dimension of the inductor 44 was 60 μm and the outer dimension of the inductor was 232 μm. The height of the segments 46 of inductor spiral 44 was 40,000 angstroms.

As seen in FIG. 4B, the metal spiral of the inductor 44 is disposed on a 10,000-angstrom layer 50 of PECVD oxide. A metal underpass 60 that is approximately 5000 angstroms thick joins the center of the inductor to pad 62. A second layer 52 of PECVD oxide approximately 20,000 angstroms in thickness is disposed between the first oxide layer 50 and the 4 μm thick (p-) Si layer 54. In one embodiment, the 4 μm thick (p-) Si layer 54 under the inductor is converted to porous Si by electrochemical etching that transforms the semiconducting Si into a semi-insulating material with an effective dielectric constant between that of bulk Si and air and a resistivity that is higher than MΩ centimeter. The porous Si layer 54 is joined to a 1 mm metal layer 56 with an additional insulating region 58. The insulating region 58 can be air or preferably an insulating material or semi-insulating material such as ceramic. These insulating layers effectively eliminate eddy current loss leading to higher quality factor (Q) and reduces the capacitive coupling between the inductor spiral 44 and the substrate thereby increasing the ($f_r$).

Figure 5:
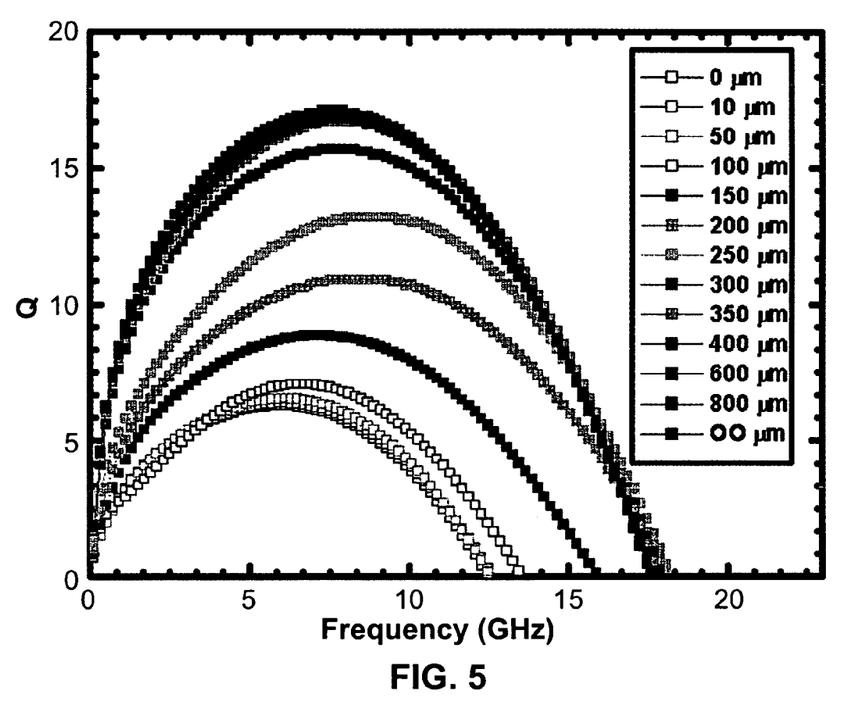
FIG. 5 is a graph of HFSS simulation results of quality factor (Q) as a function of frequency (f) for a variety of insulating cavity depths as indicated.
Figure 6A:
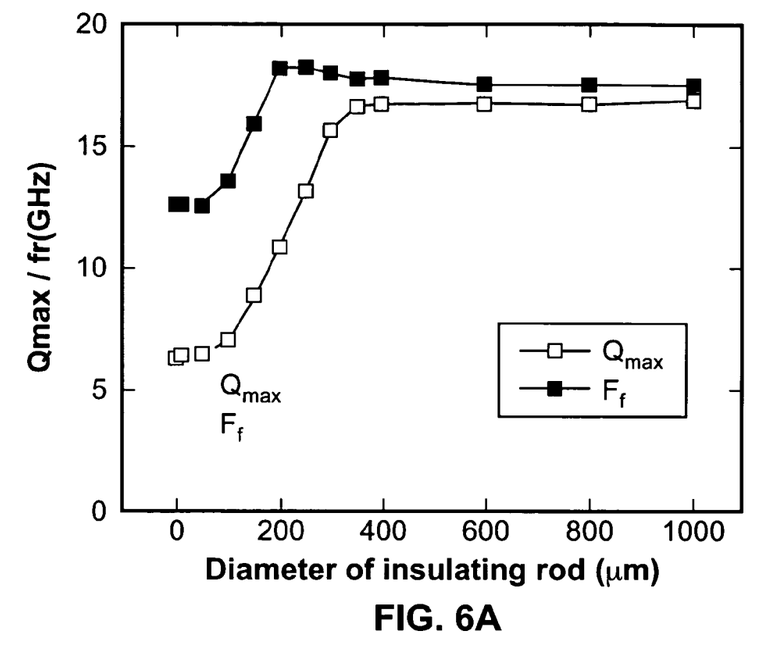
FIG. 6A is a graph showing the dependence of (Q) and (f) on the diameter or width of the insulating region of the substrate below the inductor.
Figure 6B:
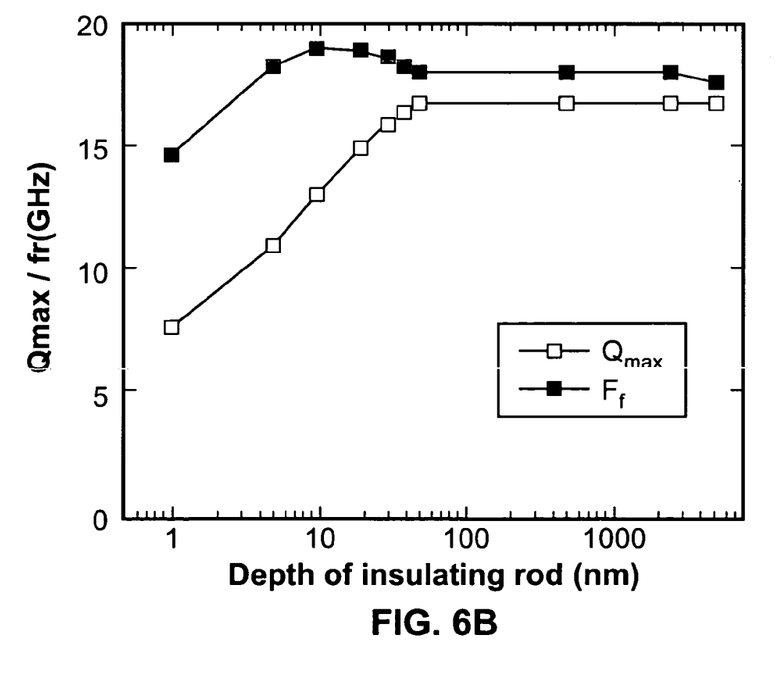
FIG. 6B is a graph showing the dependence of (Q) and (f) on the depth of the insulating region of the substrate below the inductor.

The quality factor (Q) was simulated as a function of frequency ($f_r$) for a range of insulator 58 cavity depths and shown in FIG. 5. For the given inductor footprint the necessary size of the insulating layer 58 for air was determined to ensure a satisfactory quality factor (Q) and useful frequency ($f_r$) range. If the required insulating region was too large then it could affect the mechanical integrity of the structure. FIG. 6A shows the dependence of the quality factor (Q) and frequency (f) on the diameter of the insulation region 58. FIG. 6B shows the dependence of the quality factor (Q) and frequency (f) on the depth of the insulation region 58. It can be seen in the HFSS simulation results of FIG. 5 and FIG. 6A and 6B, the performance enhancement saturates when the lateral dimension of the insulating region 58 is increased to 150%, while the depth is increased to 10% of the footprint of the inductor coil 44.

EXAMPLE 3

At the present time, flexible electronics are limited to low performance systems based on soft materials such as conducting polymers. It has been shown that hard materials can have a range of flexibility if the material is sufficiently thin. For example, commercially available 50 μm thick silicon wafers of several inches in diameter have limited flexibility similar to a credit card.

The thin silicon and copper bi-film of the present invention can also be used to provide high performance flexible integrated circuits. In one embodiment, the silicon and copper films are attached to a flexible plastic card using a stress relieving soft material that allows the bi-film to slightly glide relative to the plastic card. The function of the card is to support the films and restrict the maximum bending radius and provide the necessary mechanical integrity. The pliant stress relief layer is necessary to allow the Si—Cu bi film to bend relative to its center as opposed to that of the plastic card thereby significantly reducing the level of stress upon bending. However, because of the thermal conductivity of plastic, some silicon integrated circuits with large power consumption and a large heat load that overwhelms the heat sink capability of the metal substrate may not be suitable for this application. Even with a heat limitation, the design should permit the production of high performance flexible integrated circuits that are presently unavailable.

EXAMPLE 4

Figure 7A:
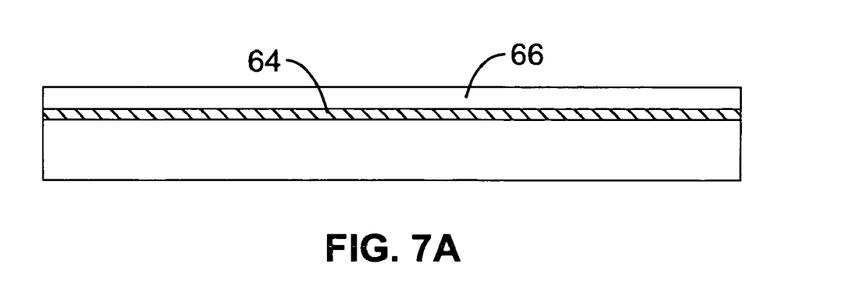
FIG. 7A through FIG. 7E are schematic processing diagrams of one method of fabrication of composite wafers according to he present invention.

Manufacturing techniques for the production of epitaxial silicon wafers has been developed and widely used for the last twenty years. Such techniques can be modified to permit the fabrication of integrated circuits with metal substrates according to the present invention. Referring now to FIG. 7A through FIG. 7E, one possible fabrication scheme is generally shown. In FIG. 7A, a thin layer 64 of a few hundred angstroms in thickness containing approximately 10% Ge is grown before the 4 μm thick (p-) silicon layer 66. The SiGe layer serves the function of an etching stop during wafer thinning in this embodiment.

Figure 7B:
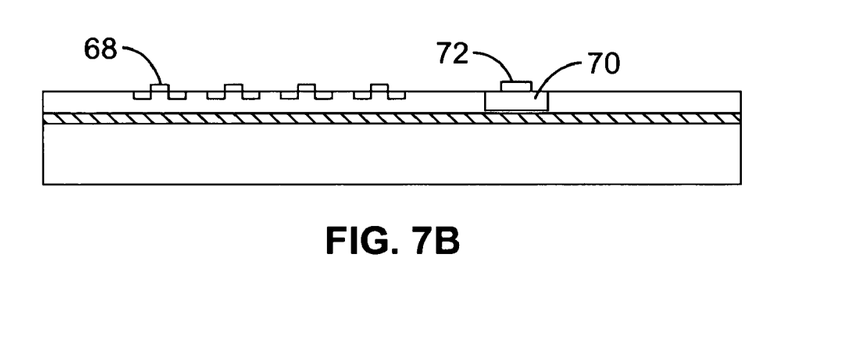

At FIG. 7B, the chip goes through standard CMOS fabrication producing, for example, transistors 68 followed by porous silicon formation 70 at the beginning of backend processing and on-chip spiral inductor 72 fabrication during metallization.

Figure 7C:
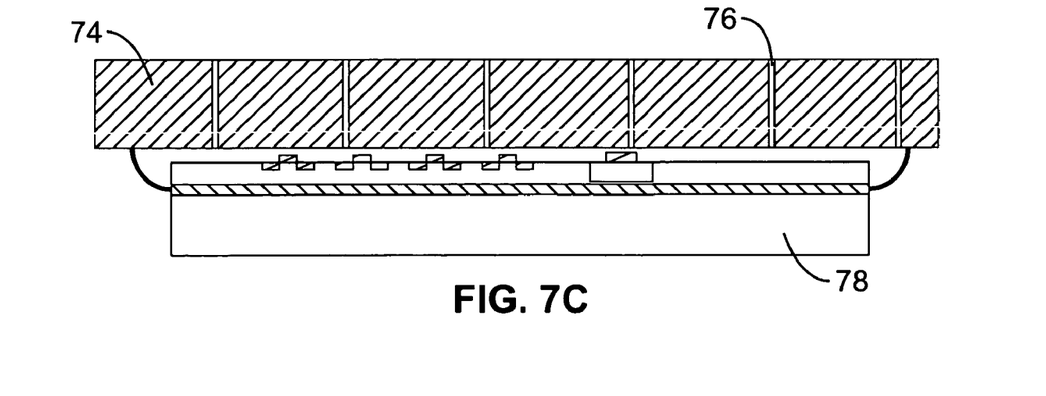

A handling jig 74 with holes 76 to facilitate chip release and high temperature wax may be used to handle the chip as shown in FIG. 7C.

Figure 7D:
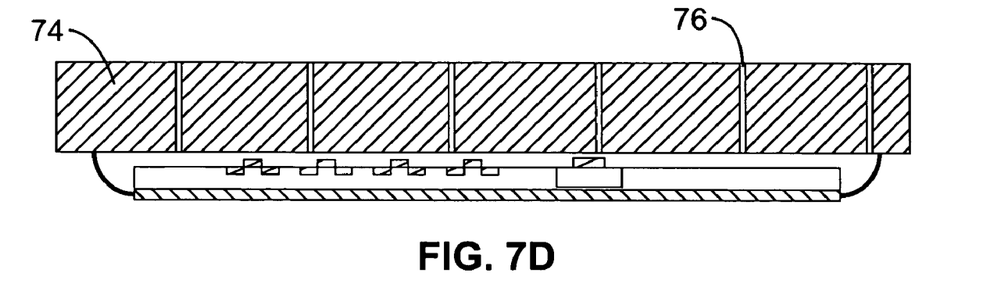

In FIG. 7D, chemical mechanical polishing takes place and the working substrate 78 is preferably removed by wet etching in the example shown.

Figure 7E:
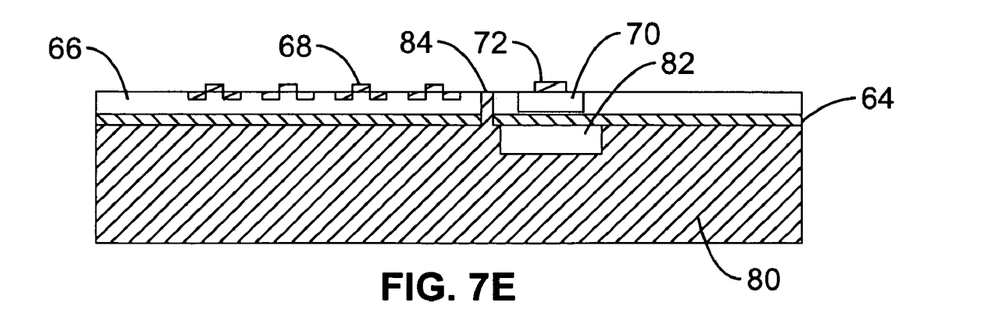

The final chip is shown in FIG. 7E. A Ti/TiN layer is preferably deposited on the backside of the silicon layers using suitable methods such as sputtering to enhance adhesion and to serve as a barrier for copper diffusion from the copper substrate 80. Preferably the area 82 in the copper substrate 80 under the inductor does not have any solder or Ti/TinN film. This can be achieved using conventional lithography by lift off. The engineered copper substrate 80 is preferably coated with conducting epoxy or the like and then bonded to the chip. In addition, the metal trench or post 84 is formed to isolate the circuits as described previously. The composite wafer is then sent through chip dicing and packaging. In the case of flexible electronics, the prepared composite wafer may then be attached to a plastic wafer with soft glue or other suitable adhesive.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An integrated circuit laminate, comprising:
   a generally planar metal substrate with a plurality of voids filled with an insulator;
   an active silicon integrated circuit layer coupled to said metal substrate; and
   a plurality of conductive walls within said active silicon circuit layer;
   wherein a sensitive circuit of said active silicon layer is insulated from digital noise.

2. An integrated circuit laminate as recited in claim 1, wherein said active silicon layer is coupled to said metal substrate with an electrically conductive adhesive.

3. An integrated circuit laminate as recited in claim 1, wherein said active silicon layer has a thickness of approximately 4.5 μm or less.

4. An integrated circuit laminate as recited in claim 1, wherein said metal substrate comprises a metal sheet having a thickness ranging from approximately 100 μm to approximately 5 mm.

5. An integrated circuit laminate as recited in claim 4, wherein said metal substrate comprises a copper sheet.

6. An integrated circuit laminate as recited in claim 1, further comprising an insulating layer disposed between said active silicon layer and said metal substrate.

7. An integrated circuit laminate as recited in claim 6, wherein said insulation layer comprises unoxidized porous silicon.

8. An integrated circuit laminate as recited in claim 6, wherein said insulation layer comprises an insulator with a thickness of between approximately 4 μm and approximately 100 μm.

9. An integrated circuit laminate as recited in claim 1, wherein said plurality of conductive walls comprises metal walls having a thickness ranging from approximately 2.5 μm to approximately 4.5 μm and a width of approximately 1 μm to approximately 1000 μm.

10. An integrated circuit laminate as recited in claim 1, wherein said insulator in said plurality of voids comprises unoxidized porous silicon.

11. An integrated circuit laminate as recited in claim 1, wherein said laminate further comprises a flexible base, said metal substrate mounted to said flexible base.

12. An integrated circuit laminate, comprising:
    a generally planar metal substrate with a plurality of voids filled with an insulator;
    a plurality of insulation layers joined to said metal substrate;
    an active silicon integrated circuit layer coupled to said insulation layers; and
    a plurality of conductive walls coupled to said metal substrate transecting said insulation layers and said active silicon circuit layer,
    wherein a sensitive circuit of said active silicon layer is insulated from digital noise.

13. An integrated circuit laminate as recited in claim 12, wherein said active silicon layer has a thickness of approximately 4.5 μm or less.

14. An integrated circuit laminate as recited in claim 12, wherein said metal substrate comprises a metal sheet having a thickness ranging from approximately 100 μm to approximately 5 mm.

15. An integrated circuit laminate as recited in claim 12, wherein said insulator in said plurality of voids comprises unoxidized porous silicon.

16. An integrated circuit laminate as recited in claim 12, wherein said laminate further comprises a flexible base, said metal substrate mounted to said flexible base.

17. An integrated circuit laminate, comprising:
    a metal substrate with a plurality of insulation filled voids;
    an insulation layer disposed on said metal substrate and insulation filled voids;
    a plurality of active silicon integrated circuit layers disposed on said insulation layer;
    at least one inductor coupled to one of said active silicon integrated circuit layers; and
    a metal underpass connected to said inductor and disposed under said top active silicon circuit layer coupled to said inductor.

18. An integrated circuit laminate as recited in claim 17, wherein said laminate further comprises a flexible base, said metal substrate mounted to said flexible base.

19. An integrated circuit laminate as recited in claim 17, wherein said insulation of said insulation filled voids comprises a ceramic insulator.

20. An integrated circuit laminate as recited in claim 17, wherein said insulation layer over said metal layer comprises a porous silicon insulator.

* * * * *

UNITED STATES PATENT AND TRADEMARK OFFICE
CERTIFICATE OF CORRECTION

PATENT NO. : 7,402,884 B2  Page 1 of 1
APPLICATION NO. : 11/402209
DATED : July 22, 2008
INVENTOR(S) : Ya-Hong Xie It is certified that error appears in the above-identified patent and that said Letters Patent is hereby corrected as shown below:

Col. 1, line 19, change "SRC 2001-NJ-936" to --0120368--.

Signed and Sealed this

Ninth Day of March, 2010

David J. Kappos
*Director of the United States Patent and Trademark Office*